United States Patent [19]
Otto et al.

[11] Patent Number: 5,472,527
[45] Date of Patent: Dec. 5, 1995

[54] HIGH PRESSURE OXIDATION OF PRECURSOR ALLOYS

[75] Inventors: Alexander Otto, Chelmsford; Lawrence J. Masur, Needham; Eric R. Podtburg, Natick, all of Mass.; Kenneth H. Sandhage, Columbus, Ohio

[73] Assignee: American Superconductor Corporation, Westborough, Mass.

[21] Appl. No.: 82,093

[22] Filed: Jun. 24, 1993

[51] Int. Cl.⁶ .............................. H01B 17/00; H01B 1/08
[52] U.S. Cl. .................... 505/431; 148/292; 148/316; 148/432; 148/DIG. 35; 429/930; 505/78; 505/736; 505/714; 505/500; 505/124; 505/482
[58] Field of Search ................. 505/1, 785, 736, 505/204, 482; 428/930; 148/282, 316, 431, DIG. 35, 432; 419/10, 19, 20, 21, 22, 87

[56] References Cited

U.S. PATENT DOCUMENTS

| | | | |
|---|---|---|---|
| 4,826,806 | 5/1989 | Yurek et al. | 505/1 |
| 4,962,085 | 10/1990 | de Barbadillo, II et al. | 505/1 |
| 5,078,810 | 1/1992 | Tanaka et al. | 148/203 |
| 5,259,885 | 4/1993 | Sandhage | 505/785 |

OTHER PUBLICATIONS

Stochel et al. "The Internal Oxidation of Silver Alloys at High Pressure and in Atomic Oxygen", Apr. 1965 pp. 286–295.

"High Temperature Behaviour of Platinum Group Metals in Oxidizing Atmospheres" H. Jehn, *Journal of the Less–Common Metals* 100, 321–339 (1984) no month.

"High–Pressure Oxidation of Refractory Metals—Experimental Methods and Interpretation" W. M. Fassel, Jr. et al., 2 *Metalkde*, 64(4) 286–295 (1973) no month.

"The Internal Oxidation of Silver Alloys at High Pressures and in Atomic Oxygen" D. Stöckel et al. AFSC *Oxidation of Tungsten and other Refractory Metals*, ML–TR–64–162 (Apr. 1965).

"Etude Diffractometrique de la Dissolution de L'Oxygene dans le Niobium a Pression Moyenne (75 Torr) et Entre 300 et 400° C" C. Perrin et al., *Journal of the Less–Common Metals* 77, 49–59 (1981) no month.

*Primary Examiner*—Mark L. Bell
*Assistant Examiner*—C. Bonner
*Attorney, Agent, or Firm*—Choate, Hall & Stewart

[57] ABSTRACT

A method for forming unsegregated metal oxide-silver composites includes preparing a precursor alloy comprising silver and precursor elements of a desired metal oxide and oxidizing the alloy under conditions of high oxygen activity selected to permit diffusion of oxygen into silver while significantly restricting the diffusion of the precursor elements into silver, such that oxidation of the precursor elements to the metal oxide occurs before diffusion of the metallic elements into silver. Further processing of the metal oxide composite affords an oxide superconducting composite with a highly unsegregated microstructure.

33 Claims, 3 Drawing Sheets

HIGH PRESSURE OXIDATION OF PRECURSOR ALLOYS

FIELD OF THE INVENTION

This invention relates to high temperature superconducting oxide composites having unsegregated microstructures. In particular, the invention relates to high temperature oxide superconductor-metal composites prepared by high pressure oxidation of metallic precursors.

BACKGROUND OF THE INVENTION

Oxide superconductors have been prepared by oxidation of a precursor alloy which contains the constituent metallic elements of the oxide superconductor and the matrix metal (typically, primarily silver). The matrix metal must itself be inert to oxidation or "noble" under the oxidation conditions employed during the process. The heat treatment of the composite is preferably carried out in two steps. A first heat treatment is carried out at relatively low temperatures in order to oxidize the component precursor elements into simple metal oxides or "suboxides". Subsequent heat treatments are then carried out at higher temperatures to convert the suboxide phases into the superconducting oxide phase(s). By "suboxide" as that term is used herein, it is meant simple, binary and/or ternary oxides of the component metals of the superconducting oxide.

Despite the relatively rapid diffusion of oxygen through the silver matrix phase, full oxidation of the metallic components into suboxides (in a first thermal treatment) can require extremely long times (for example, 600 hours). During heating at elevated temperatures, the mobilities of the precursor elements and their cationic forms are enhanced. The precursor elements diffuse into the surrounding silver metal, thereby impairing the chemical and physical integrity of the composite. This has the effect of interfering with the formation of oxide superconductor composites with good physical and electrical properties.

By "precursor elements", as that term is used herein, it is meant the individual metallic elements of the precursor alloy or their cationic forms. Typically, the precursor elements diffuse as neutral species; however, cations are also expected to contribute, in varying degrees, to the mobility of the precursor elements. Copper has the highest mobility of the constituent precursor elements, but also barium in the yttrium-barium-copper-oxygen (YBCO) system, bismuth and/or lead in the bismuth(lead)-strontium-calcium-copper-oxide (BSCCO) system and thallium and/or lead in the thallium(lead)-strontium-calcium-copper-oxide (TlSCCO) system are known to diffuse into the silver matrix. It is expected that given sufficient time and appropriate reaction conditions, other elements will also have measurable mobilities in silver at a level sufficient to impair composite mechanical and electrical properties.

In particular, the ability of precursor elements to segregate during thermal treatment has made it difficult to prepare multifilamentary wires having high filament counts. By "multifilamentary wires", as that term is used herein, it is meant wire, rods, tapes and the like, containing oxide superconductor filaments within a matrix metal, where the filaments run axially parallel to one another along the length of the wire, the "longest dimension". By "high filament count", as that term is used herein, it is meant filament densities of greater than 10,000 filaments/$cm^2$ as determined for a cross-section transverse to the longest dimension. At high filament densities, even the slightest segregation of precursor elements results in the coalescence of individual filaments and the deterioration of wire properties.

High oxygen pressure has been used in the internal oxidation of Sn-Ag alloys. Tanaka et al. in U.S. Pat. No. 5,078,810 (hereinafter, "Tanaka") observed that high pressure oxidation eliminated scale formation of tin oxides on the outer surface of the silver composite due to the diffusion of tin to the surface. Tanaka addresses the problem of tin migration to the composite surface and not the segregation of tin within the composite. Indeed, segregation such as that observed for complex oxide superconductor composites can not occur in the simple tin oxide-silver composites disclosed by Tanaka.

It is an object of the present invention to provide a low temperature oxidation process for preparation of a metal oxide which minimizes diffusion and segregation of the precursor elements into the silver phase without unfavorably affecting the oxidation time.

It is a further object of the invention to provide a low temperature oxidation process for preparation of an oxide superconductor which minimizes diffusion and segregation of the precursor elements into the silver phase without unfavorably affecting the oxidation time. The object of the present invention provides an oxide superconductor composite with improved properties, such as high critical current density.

It is a further object of the invention to provide an oxide superconductor multifilamentary composite wire characterized by a highly unsegregated microstructure and a high filament count.

SUMMARY OF THE INVENTION

The invention provides a method for making an unsegregated oxide superconductor silver composite. The invention also provides a multifilamentary oxide superconductor-silver composite having an unsegregated microstructure and a high filament count. By "unsegregated" as that term is used herein, it is meant that little or none of the precursor elements have diffused away (or become segregated) from the precursor alloy region. Because diffusion occurs under oxidizing conditions, segregated precursor elements are identified as oxide phases enriched in segregated elements(s), i.e., CuO, PbO, $Bi_2O_3$, etc., in the final metal oxide or oxide superconductor composite.

In one aspect of the present invention, an unsegregated metal oxide/silver composite is prepared by forming a precursor alloy comprising silver and precursor elements having the stoichiometry of a desired metal oxide and oxidizing the precursor alloy under conditions of high oxygen activity selected to permit diffusion of oxygen into silver while significantly restricting the diffusion of the precursor elements into silver, so that oxidation of the precursor elements to the desired metal oxide occurs before diffusion of the precursor elements into silver. For the purposes of the invention, "high oxygen activity" is defined as oxygen activity equivalent to the activity of pure oxygen in its gaseous form ($O_2$) at a temperature greater than 200° C. and at a pressure greater than ambient.

According to the invention, an unsegregated oxide superconductor-silver composite is prepared by further heating the metal oxide-silver composite obtained as described hereinabove under conditions selected to convert the metal oxides into the desired oxide superconductor.

In preferred embodiments, the oxidation of the metal precursor to the metal oxide is carried out at a temperature in the range of 250°–450° C., and more preferably 320°–430° C. In preferred embodiments, high oxygen activity is attained using high oxygen pressure, oxygen-releasing gases or electromagnetic means. The high oxygen pressure ranges from above ambient to substantially the oxygen threshold pressure for the formation of silver oxide. The $P_{O2}$ range is preferable 15–3000 psi, more preferably 800–3000 psi and most preferably 1200–1800 psi. In another preferred embodiment, the precursor alloy is oxidized at a temperature in the range of 200° to 450° C. and at an oxygen pressure in the range of 15 to 3000 psi.

In yet another preferred embodiment, a second gas is used to dilute the oxygen for enhanced total pressure above the desired oxygen pressure. Total gas pressures can range from 16 to 60,000 psi and the diluting gas may be any non-reactive gas, such as Ar, $N_2$, He, Ne, Kr or Xe.

Another aspect of the invention provides for a dense (pore or void-free) oxide superconductor composite having a discreet oxide superconductor phase and a silver phase with little or no diffusion of precursor elements into the silver phase. "Little or no diffusion" is defined as having a metal oxide no more than a distance of three microns from the corresponding oxide superconducting phase. An oxide superconductor composite is characterized as having a microstructure in which a cross-section transverse to a longest dimension consists of the silver matrix and a clearly defined oxide superconductor regions having a density of oxide regions of at least 10,000 regions/cm$^2$.

Yet another aspect of the invention provides for a dense (pore or void-free) metal oxide composite having a discreet metal oxide phase and a silver phase with little or no diffusion of precursor elements into the silver phase. "Little or no diffusion" is defined as having a metal oxide no more than a distance of three microns from the corresponding metal oxide phase. A metal oxide composite is characterized as having a microstructure in which a cross-section transverse to a longest dimension consists of the silver matrix and a clearly defined metal oxide regions having a density of oxide regions of at least 10,000 regions/cm$^2$.

The method of the present invention, prevents "loss" of the desired metal oxide phase due to diffusion of particular precursor elements into the silver matrix by dramatically reducing precursor element mobilities during processing. Conversion of the precursor elements to the final oxide superconductor is more complete, since off-stoichiometry in the precursor oxide phase is greatly reduced. Further, texturing of the oxide superconductor phase is more efficient when residual blocky precursor oxide phases (typically formed due to off-stoichiometry in the starting precursor oxide) have been eliminated.

BRIEF DESCRIPTION OF THE DRAWING

The file of this patent contains at least one drawing executed in color. Copies of this patent with color drawing(s) will be provided by the Patent and Trademark Office upon request and payment of the necessary fee.

In the Drawing.

DESCRIPTION OF THE PREFERRED EMBODIMENT

The present invention provides a method for oxidizing a precursor alloy to optimize the competing effects of oxidation time and precursor element mobility. The precursor elements are immobilized without significantly extending and, in some cases, even reducing the oxidation time.

Segregation occurs by migration of the precursor elements of the alloy into the silver matrix, where they are oxidized to form the corresponding metal oxides. Once formed, the cations of the metal oxides can no longer diffuse readily through the silver matrix. However, because the segregated cations are not present in the proper stoichiometry to form the desired metal oxide or oxide superconductor when subjected to subsequent thermal treatments under conditions favorable to the desired oxide formation, the cations remain as particles surrounding the newly formed desired oxide phase (see, FIG. 2).

The faster the low temperature thermal treatment is completed, the less time the precursor elements have to diffuse into the silver matrix and the extent of segregation is therefore reduced. However, the mass transport rate of the oxygen through the silver must be increased without altering the transport rates of the precursor elements if significant precursor element segregation is to be avoided. The increased mass transport rate of oxygen can be accomplished by increasing the oxygen activity of the system. Hence, unsegregated metal oxide composites may be achieved by a thermal process at "low" temperatures in combination with conditions of high oxygen activity.

Figure 1:
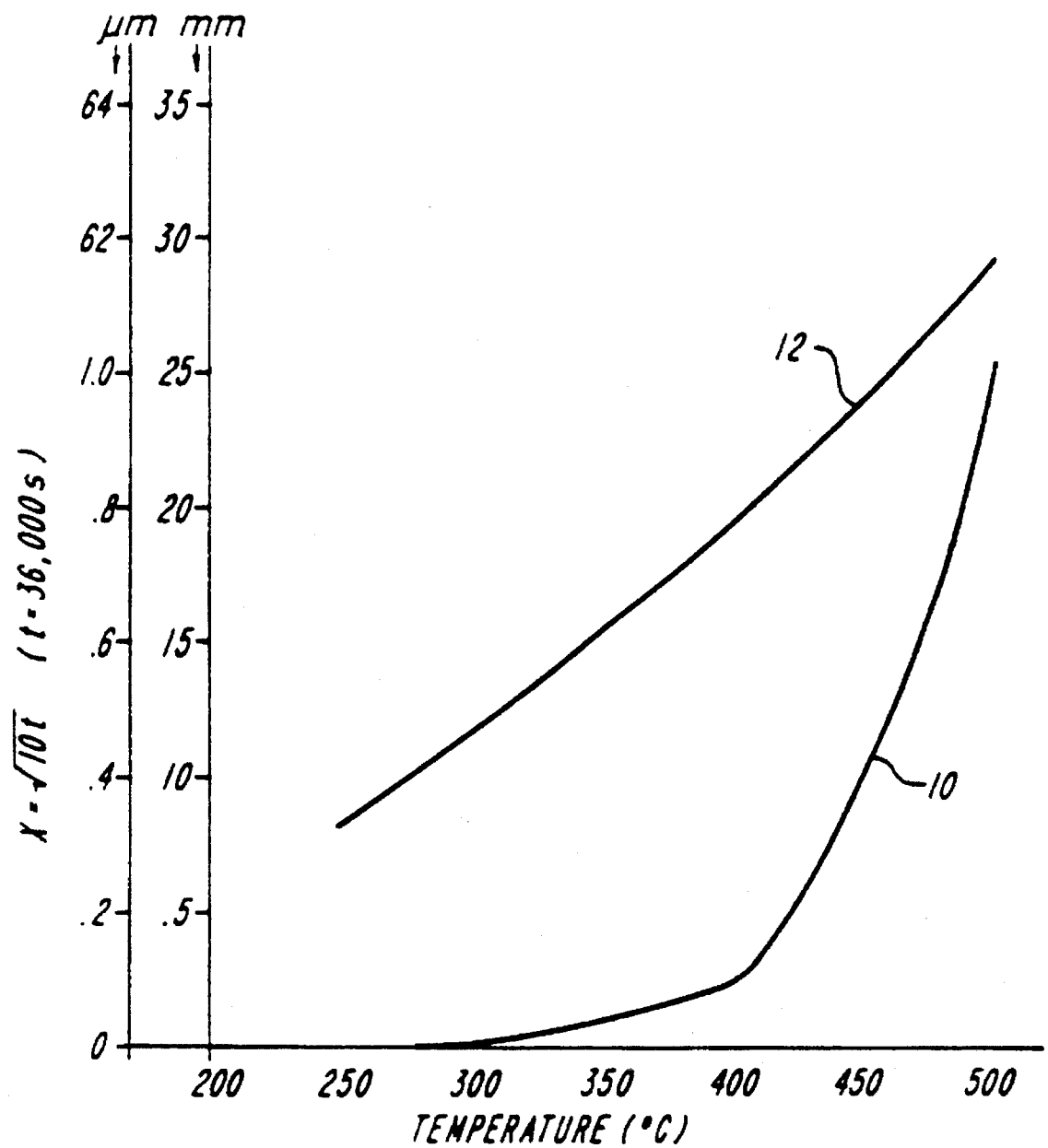
FIG. 1 is a plot of diffusivity of oxygen and copper into silver as a function of temperature.

At sufficiently low temperatures, the precursor elements of the alloy are effectively prevented from travelling any significant distance through the matrix in the time it takes to fully oxidize the composite. This is possible because the diffusion rate of oxygen through the silver is less dependent upon temperature than the diffusion rate of precursor elements. FIG. 1 illustrates the temperature dependences of copper and oxygen diffusion through silver using a plot of diffusion distance v. temperature. The diffusion distance, x, of the ordinate represents the distance the element of interest has diffused into a silver matrix after a period of 10 hours under ideal conditions. It is clear from FIG. 1, that all diffusion rates increase with increasing temperature and the curve form is exponential. Note that the diffusion of oxygen into silver uses the millimeter (mm) scale for the ordinate, while the diffusion of copper into silver uses the micrometer (μm) scale for the ordinate. However, the diffusion of copper into silver (represented by curve 10) has a more rapidly increasing exponential form than that of oxygen into silver (represented by curve 12). Hence, the distance diffused by copper into silver increases very rapidly as temperature increases, in particular, at a temperature greater than approximately 400° to 430° C. Hence, diffusion of the precursor elements can be effectively halted by holding the oxidation temperature below the temperature at which diffusion increases at a rapid rate, i.e., less than approximately 450° C.

To compensate for the reduced diffusivity of oxygen at the lower oxidation temperatures, the oxygen activity of the system is increased. Diffusivity of the precursor elements of the alloy and oxygen is $P_{O2}$ independent. However, an increase in oxygen pressure increases the amount of oxygen that is dissolved in the silver matrix and thereby the flux of oxygen through silver is increased. This has the effect of increasing the mass transport of oxygen through silver, while the diffusivity (and mass transport) of the precursor elements is unaffected.

In a preferred embodiment, the oxidation temperature range for a precursor alloy is 200° C. to 450° C. In particular, precursors to bismuth(lead)-strontium-calcium-copper-containing oxide superconductors have thermal treatment temperatures in the range of 360° C. to 430° C. Precursors to thallium(lead)-strontium-calcium-copper-containing oxide superconductors have thermal heat treatment temperatures in the range of 200° C. to 450° C. The thermal heat treatment temperature is in the range of 300° C. to 350° C. for the precursors to rare earth-barium-copper-containing oxide superconductors.

The selected temperature ranges described hereinabove have the additional benefit in that they are below the recrystallization temperature of silver ($T_{crystal}$) in most instances. The grain structure of silver influences the mass transport of oxygen. If the temperature of oxidation is below the recrystallization temperature of silver (~200°–400° C.), the silver matrix retains its fine-grained structure (assuming it is fined grained at the onset). It is then possible for oxygen to be transported along the silver grain boundaries. Hence, oxygen transport is enhanced in fine grained silver matrices by oxidation below the recrystallization temperature of silver.

The present invention calls for high oxygen activity. The requisite "high oxygen activity" for the present invention is equivalent to the activity of pure oxygen in its gaseous form ($O_2$) in the temperature range of 250° C. to 450° C. and at pressures in the range of 15 psi to 3000 psi. This can be accomplished in a number of ways, for example by using high oxygen pressure ($P_{O2}$), or by using activated forms of oxygen, generated, for example, by oxygen-releasing gases or electromagnetic means.

Oxygen-releasing gases are known in the art and include, but are in no way limited to, ozone, $NO_x$, and the like. Electromagnetic means include high frequency radiation, such as microwave radiation, which are capable of generating reactive forms of oxygen. Anodization is another known way to generate reactive oxygen species.

In a preferred embodiment, high oxygen pressure is used as the high oxygen activity means. The rate of oxidation of the precursor elements increases as oxygen pressure increases up to a maximum rate corresponding to the onset of extensive silver oxide formation at the outer surface of the silver composite ("threshold pressure"). Oxidation rates are substantially independent of oxygen pressure beyond this point (threshold pressure of silver oxide formation). The threshold pressure will vary with temperature. For example, the threshold pressure is 1500 psi at 400° C. At lower temperatures, the threshold pressure of silver oxide decreases. For example, a threshold pressure of 300 psi at 330° C. is typical. It is desirable but not necessary to operate at oxygen pressures at or near the threshold pressures. It is also possible to operate at oxygen pressures above the threshold pressures. The oxygen pressure preferably is in the range of 15 psi to 3000 psi, more preferably in the range of 800–3000 psi and most preferably in the range of 1200–1800 psi.

In another preferred embodiment, the total gas pressure can range up to 60,000 psi. The oxygen pressure will still be in the preferred ranges described above; however, it is diluted with a second gas to enhance the total pressure of the system. The diluting gas may be any non-reactive gas, such as Ar, $N_2$, He, Ne, Kr or Xe. The addition of the diluting gas will affect the total oxygen activity and a slightly greater oxygen pressure may be needed in the mixed gas system for oxygen activity comparable to the oxygen-only system. In preferred embodiments, the alloy is oxidized at an oxygen pressure in the range of 800–3000 psi and a total gas pressure of 801–60,000 psi with a second gas used to dilute the oxygen for enhanced total pressure above the desired oxygen pressure. In other embodiments, the alloy may be oxidized at an oxygen pressure in the range of 1200–1800 psi and a total gas pressure of 1201–60,000 psi with a second gas used to dilute the oxygen for enhanced total pressure above the desired oxygen pressure. Enhanced total pressure is useful to prevent local strain/stress splitting of the oxide superconducting grains which may occur due to the volume change associated with oxidation.

Typically, the multifilamentary oxide composites of the invention take the form of a silver wire, ribbon or tape. A multifilamentary composite such as that shown in FIG. 2 is prepared in the following manner. The tape is formed by introducing finely divided precursor elements into a silver can and extruding the powder filled can into a wire of much smaller diameter. A number of extruded wires are then grouped together and co-extruded to form a wire having a plurality of metallic precursor filaments therein. Regrouping and co-extruding can be continued until the desired number of filaments are obtained. Tapes having filament counts of 100–2,000,000 have been prepared.

The method of the invention is described in the following experiment, with reference to FIG. 2. FIGS. 2a and 2b show a cross-sectional view of a $YBa_2Cu_4O_x$-silver composite containing multiple filaments of metal oxide in a silver matrix. In the figure, dark areas 20 represent the oxide superconductor phase and light areas 22 represent silver phase.

Bundles of six silver-precursor alloy composite multifilamentary tapes are placed in a pressure vessel with a 0.25" (0.635 cm) bore and purged by two "pressurize and drain cycles" at ambient pressure. The tapes are 0.10"×0.02" (0.254 cm×0.0508 cm) in cross section and 1" (2.54 cm) long. They contain 2527 filaments of copper-sheathed $YBa_2$ alloy filaments with a precursor element stoichiometry of $YBa_2Cu_4$ and a precursor element fill factor of 10 vol %. Each bundle is heated to 320° C. (at about 2000 psi oxygen pressure) by inserting the pressure vessel into the hot zone of a preheated furnace. The samples are heated for 10 to 20 h, and then are withdrawn from the furnace and air cooled. The samples are fully oxidized after 10 to 20 hr. This is more than an order of magnitude faster than the required time for full oxidation at ambient pressure.

A polished cross section of the tape is examined by optical microscopy. The fully oxidized sample at 320° C. shows no discernable copper diffusion and the precursor geometry is preserved throughout the composite. Samples processed according to the method described hereinabove have been tested for superconductivity and found to have an onset of zero resistance at a temperature of 82K.

A lead doped Bi-2223 oxide superconductor is processed in the following manner. A lead doped Bi-2223 precursor alloy powder is made by mechanical alloying the elements with up to 50 volume percent silver. The alloy powder is packed into a silver can and deformed repeatedly. A number of extruded wires are then grouped together and co-extruded to form a tape having a plurality of metallic precursor filaments therein. Regrouping and co-extruding can be continued until the desired number of filaments are obtained, yielding the multifilamentary precursor alloy silver matrix composite tape with a typical cross-sectional dimension of 0.75 mm×3.8 min. A tape with 259 filaments and a precursor element fill factor equivalent of 15 volume percent is oxidized at 400° C. in 2.9 ksi oxygen for 300 hours for full oxidation with effectively no segregation of the precursor elements from the filaments.

Figure 2A:
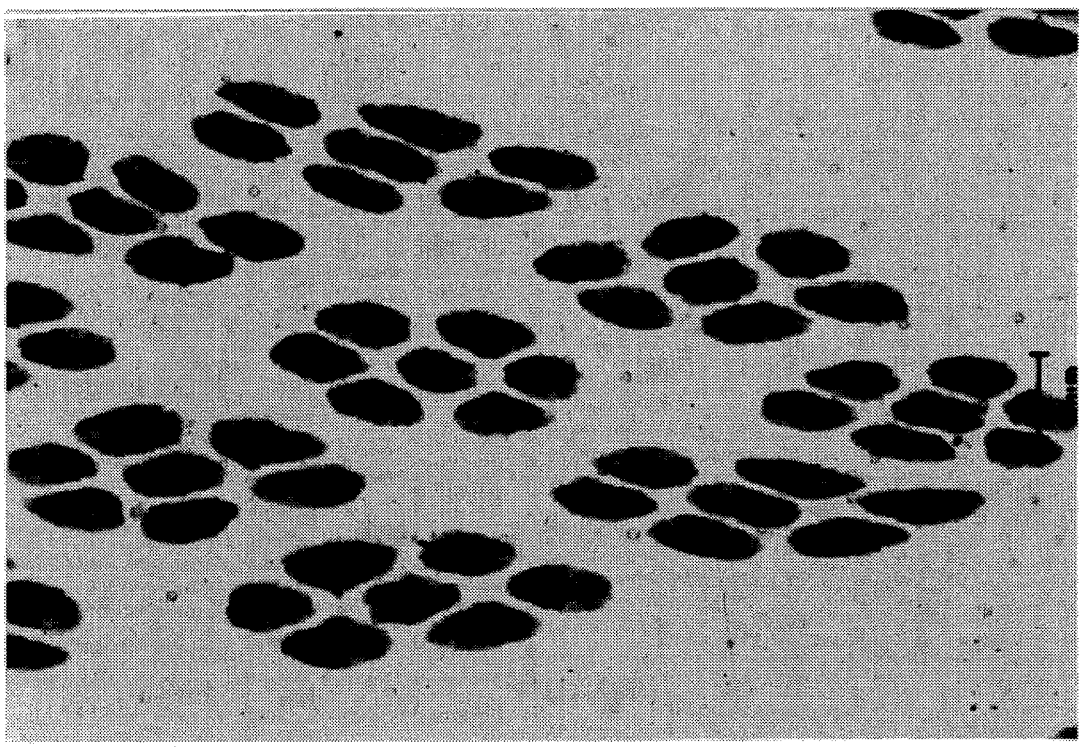
FIG. 2 is an optical photomicrograph of a multifilamentary $YBa_2Cu_4O_x$ oxide superconductor-silver composite oxidized at (a) high temperature and ambient oxygen pressure, and (b) low temperature and high oxygen pressures for the same amount of time.
Figure 2B:
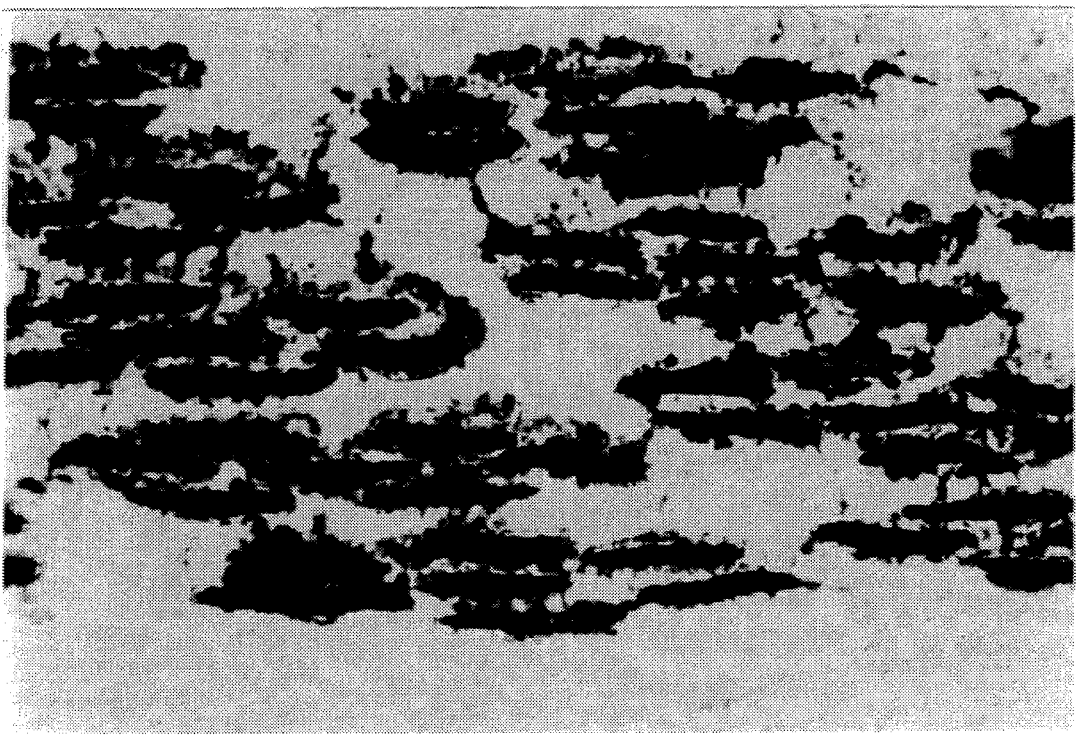

FIG. 2 illustrates the improvement in composite microstructure arising from the method of the invention employing both a lower temperature and a higher than ambient oxygen pressure. FIG. 2a is a photomicrograph of a conventionally processed composite cross-section (containing 2527 filaments) that has been oxidized at 600° C. for 200 hours at ambient oxygen pressures. The boundary between the metal oxide regions and the silver matrix is poorly defined due to the high degree of diffusion of metallic elements (primarily Cu as CuO) in the silver matrix. In comparison, FIG. 2b is a photomicrograph of a composite cross-section (containing 2527 filaments) that has been oxidized at 340° C. for 200 h in 2000 psi oxygen. The boundary between the circular regions of the metal oxide and the silver matrix are much more clearly defined. The intrusion of the metal oxide into the silver is effectively eliminated in the composite of FIG. 2b subjected to the low temperature/high oxygen pressure thermal treatment of the present invention.

Figure 3:
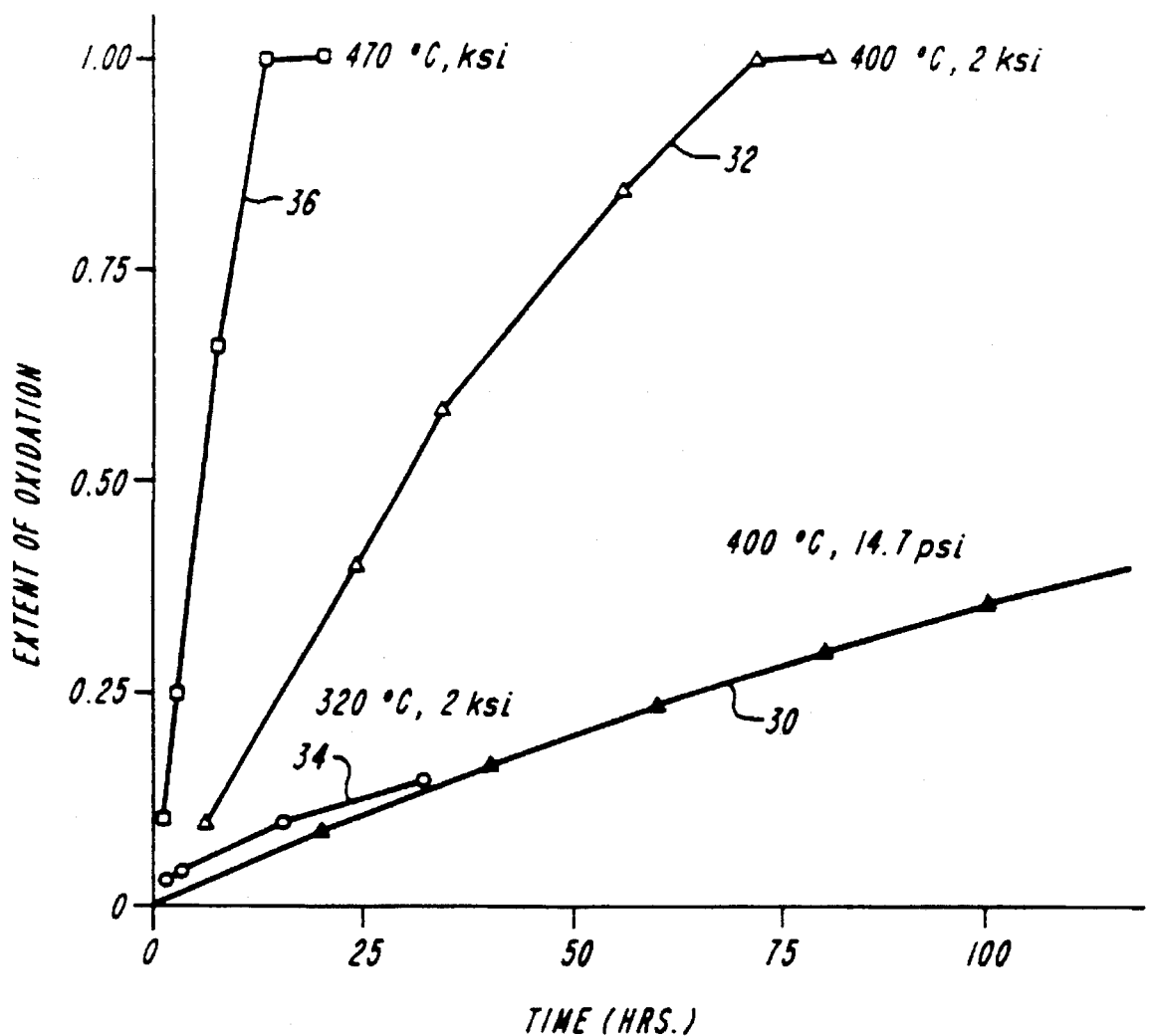
FIG. 3 is a plot of extent of oxidation v. time at several temperatures and for two different pressure regimes.

FIG. 3 is a plot of the extent of oxidation v. time at two oxygen pressures, ambient and 2000 psi, for $Y_1Ba_2Cu_4O_x$ composite samples. Full oxidation is indicated by an extent of oxidation equal to 1. The rate of oxidation increases by approximately one order of magnitude for an oxygen pressure increase from ambient to 2000 psi, as evidenced by comparison of curve 30 (400° C., 14.7 psi) to curve 32 (400° C., 2000 psi) in FIG. 3. Although oxidation rate decreases with decreasing temperature, the increase in oxygen pressure can more than compensate for the temperature-induced rate decrease as illustrated by the comparable slopes for curve 30 (400° C., 14.7 psi) and curve 34 (320° C., 2000 psi). While a high temperature, high pressure thermal treatment such as that of curve 36 (470° C., 2000 psi) affords rapid oxidation, the extent of segregation is still considerable and not acceptable for superconducting applications. The resulting microstructure is not optimal because the higher temperature has not permitted an immobilization of the precursor elements. The best improvement in segregation is achieved by lowering the oxidation temperature while employing a high oxygen activity (here, pressure).

Once the metal oxide-silver composite is formed, it may be further heat treated using techniques known in the art to prepare an oxide superconductor. For example, the method can be applied to the preparation of all oxide superconductors, including but not limited to, $YBa_2Cu_3O_x$, wherein x is sufficient to provide an oxide superconductor having a $T_c$ greater than 77K; $YBa_2Cu_4O_x$, wherein x is sufficient to provide an oxide superconductor having a $T_c$ greater than 77K; $(Bi,Pb)_2Sr_2Ca_2Cu_2O_x$, wherein x is sufficient to provide an oxide superconductor having a $T_c$ greater than 100K, $(Bi,Pb)_2Sr_2Ca_1Cu_2O_x$, wherein x is sufficient to provide an oxide superconductor having a $T_c$ greater than 77K, $Hg_1Ba_2Ca_2Cu_3O_x$, wherein x is sufficient to provide an oxide superconductor having a $T_c$ greater than 100K, $Hg_1Ba_2Ca_1Cu_2O_x$, wherein x is sufficient to provide an oxide superconductor having a $T_c$ greater than 100K, $Hg_1Ba_2Cu_1O_x$, wherein x is sufficient to provide an oxide superconductor having a $T_c$ greater than 77K, wherein x is sufficient to provide an oxide superconductor having a $T_c$ greater than 100K, $(Tl,Pb)_1Sr_2Ca_1Cu_2O_x$; wherein x is sufficient to provide an oxide superconductor having a $T_c$ greater than 100K; and $(Tl,Pb)_1Sr_2Ca_2Cu_3O_x$, wherein x is sufficient to provide an oxide superconductor having a $T_c$ greater than 100K. Addition of other elements in small quantities to these oxide compositions do not alter the scope or spirit of the invention. The above oxide compositions are nominal; slight deviations therefrom are within the scope of the invention.

As the precursor elements are effectively immobilized as cation components of metal oxides, higher temperature processes can be employed without further segregation. For example, the metal oxide-silver composite is heated at 0.075 atm oxygen at 780° C. for 10 h, held at 815° C. for 50 h and then cooled to form the oxide superconductor, $Bi_2Sr_2Ca_2Cu_3O_x$ (2223-BSCCO). Similarly, the metal oxide-silver composite is heated at 1.0 psi oxygen at 900° C. for 50 h, held at 450° C. for 100 h and then cooled to form the oxide superconductor, $YBa_2Cu_3O_x$ (123-YBCO).

The composites of the present invention are characterized by their uniquely unsegregated composite microstructure and high filament count. For example, the silver matrix contains no oxide beyond a distance of 3 μm from the interface of the bulk oxide phase (metal oxide or oxide superconductor) and the silver matrix. Expressed in different terms, the oxide-silver composite has a microstructure in which a cross-section transverse to the longest dimension consists of a silver matrix and a clearly defined oxide (metal oxide or oxide superconductor) region having a density of oxide regions of at least 10,000 regions/cm$^2$. Densities of well over 32,000 regions/cm$^2$ up to 1,500,000 regions/cm$^2$ have been observed without any degradation of electrical and mechanical properties. In order for densities on this scale to occur without impairment of the electronic and mechanical properties of the composite, little or no segregation must occur between neighboring filaments.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

What is claimed is:

1. A method for preparing an unsegregated metal oxide/silver composite, comprising the steps of:

preparing a precursor alloy comprising precursor elements in a stoichiometry sufficient to provide a complex metal oxide, the precursor alloy disposed within a silver matrix; and oxidizing the precursor alloy under a condition wherein oxygen activity is equivalent to the activity of pure oxygen in its gaseous form (O$_2$) at a temperature greater than 200° C. and at a pressure greater than ambient selected to permit diffusion of oxygen through the silver matrix and at a temperature sufficiently low to significantly restrict the diffusion of the precursor elements away from the precursor alloy phase and into the silver matrix, such that the stoichiometry of the precursor elements throughout the precursor alloy phase is substantially preserved during the oxidation, whereby a complex metal oxide is obtained.

2. A method for preparing an unsegregated oxide superconductor/silver composite, comprising the steps of:

preparing a precursor alloy, the precursor alloy comprising precursor elements in a stoichiometry sufficient to provide an oxide superconductor, the precursor alloy disposed within a silver matrix;

oxidizing the precursor alloy under a condition wherein oxygen activity is equivalent to the activity of pure oxygen in its gaseous form ($O_2$) at a temperature greater than 200° C. and at a pressure greater than ambient selected to permit diffusion of oxygen through the silver matrix and at a temperature sufficiently low to significantly restrict the diffusion of the precursor elements away from the precursor alloy phase and into the silver matrix, such that the stoichiometry of the precursor elements throughout the precursor alloy is substantially preserved during the oxidation, whereby a corresponding metal oxide is obtained; and heating the corresponding metal oxide at a temperature and pressure selected to convert the metal oxide into the oxide superconductor.

3. The method of claim 1 or 2, wherein high oxygen activity is obtained using high oxygen pressure.

4. The method of claim 3, wherein the precursor alloy is oxidized at a temperature in the range of 200°–450° C.

5. The method of claim 3, wherein the precursor alloy is oxidized at a temperature in the range of 300°–430° C.

6. The method of claim 1 or 2, wherein high oxygen activity is obtained using an oxygen-releasing gas.

7. The method of claim 1 or 2, wherein high oxygen activity is obtained by applying electromagnetic radiation.

8. The method of claim 1 or 2, wherein the precursor alloy is oxidized at a temperature in the range of 200°–450° C.

9. The method of claim 1 or 2, is oxidized at a temperature in the range of 300°–430 ° C.

10. The method of claim 1 or 2, wherein the precursor alloy is oxidized at an oxygen pressure above ambient pressure.

11. The method of claim 1 or 2, wherein the precursor alloy is oxidized at an oxygen pressure in the range of 15–3000 psi.

12. The method of claim 1 or 2, wherein the precursor alloy is oxidized at an oxygen pressure in the range of 800–3000 psi.

13. The method of claim 1 or 2, wherein the precursor alloy is oxidized at an oxygen pressure in the range of 1200–1800 psi.

14. The method of claim 1 or 2, wherein the precursor alloy is oxidized at a temperature in the range of 200° to 450° C. and at an oxygen pressure in the range of 15 to 3000 psi.

15. The method of claim 1 or 2, wherein the precursor alloy is oxidized at an oxygen pressure in the range of 15–3000 psi and a total gas pressure of 16–60,000 psi with a second gas used to dilute the oxygen for enhanced total pressure above the desired oxygen pressure.

16. The method of claim 1 or 2, wherein the precursor alloy is oxidized at an oxygen pressure in the range of 800–3000 psi and a total gas pressure of 801–60,000 psi with a second gas used to dilute the oxygen for enhanced total pressure above the desired oxygen pressure.

17. The method of claim 1 or 2, wherein the precursor alloy is oxidized at an oxygen pressure in the range of 1200–1800 psi and a total gas pressure of 1201–60,000 psi with a second gas used to dilute the oxygen for enhanced total pressure above the desired oxygen pressure.

18. The method of claim 1 or 2, wherein the precursor alloy in a silver matrix is prepared by a method comprising the steps of:

introducing finely divided precursor elements into a silver can;

extruding the precursor element-containing can into a first wire;

grouping a plurality of extruded first wires to form a bundle of wires; and co-extruding the bundle of wires to form a second wire having a plurality of precursor element filaments therein.

19. The method of claim 1, wherein the precursor alloy additionally contains silver dispersed in the precursor alloy phase.

20. The method of claim 2, wherein, the precursor alloy additionally contains silver dispersed in the precursor alloy phase.

21. The method of claim 2, wherein the oxide superconductor comprises $YBa_2Cu_3O_x$, wherein x is sufficient to provide an oxide superconductor having a $T_c$ greater than 77K.

22. The method of claim 2, wherein the oxide superconductor comprises $YBa_2Cu_4O_x$, wherein x is sufficient to provide an oxide superconductor having a $T_c$ greater than 77K.

23. The method of claim 2, wherein the oxide superconductor comprises $Bi_2Sr_2Ca_2Cu_3O_x$, wherein x is sufficient to provide an oxide superconductor having a $T_c$ greater than 100K.

24. The method of claim 2, wherein the oxide superconductor comprises $(Bi,Pb)_2Sr_2Ca_{2a}Cu_3O_x$, wherein x is sufficient to provide an oxide superconductor having a $T_c$ greater than 100K.

25. The method of claim 2, wherein the oxide superconductor comprises $(Bi,Pb)_2Sr_2Ca_1Cu_2O_x$, wherein x is sufficient to provide an oxide superconductor having a $T_c$ greater than 77K.

26. The method of claim 2, wherein the oxide superconductor comprises $Hg_1Ba_2Ca_2Cu_3O_x$, wherein x is sufficient to provide an oxide superconductor having a $T_c$ greater than 100K.

27. The method of claim 2, wherein the oxide superconductor comprises $Hg_1Ba_2Ca_1Cu_2O_x$, wherein x is sufficient t provide an oxide superconductor having a $T_c$ greater than 100K.

28. The method of claim 2, wherein the oxide superconductor comprises $Hg_1Ba_2Cu_1O_x$, wherein x is sufficient to provide an oxide superconductor having a $T_c$ greater than 77K.

29. The method of claim 2, wherein the oxide superconductor comprises $(Tl, Pb)_1Sr_2Ca_1Cu_2O_x$, wherein x is sufficient to provide an oxide superconductor having a $T_c$ greater than 100K.

30. The method of claim 2, wherein the oxide superconductor comprises $(Tl, Pb)_1Sr_2Ca_2Cu_3O_x$, wherein x is sufficient to provide an oxide superconductor having a $T_c$ greater than 100K.

31. An oxide superconductor-silver composite prepared according to the method of claim 2 and having clearly defined oxide regions.

32. The composite of claim 31, further characterized in that the silver matrix contains no metal oxide beyond a distance of three microns from the interface of a corresponding oxide superconductor phase and silver matrix.

33. The composite of claim 31, further characterized in that the oxide superconductor-silver composite has a microstructure in which a cross-section transverse to a longest dimension consists of the silver matrix and a clearly defined oxide superconductor regions having a density of oxide regions of at least 10,000 regions/cm$^2$.

* * * * *

UNITED STATES PATENT AND TRADEMARK OFFICE
CERTIFICATE OF CORRECTION

PATENT NO. : 5,472,527
DATED : December 5, 1995
INVENTOR(S) : Alexander Otto, et. al.

It is certified that error appears in the above-indentified patent and that said Letters Patent is hereby corrected as shown below:

In Sheet 2 of the Drawings, please delete legend "Figure 2A" under the upper photograph and insert therefor --Figure 2B--.

In Sheet 2 of the Drawings, please delete legend "Figure 2B" under the lower photograph and insert therefor --Figure 2A--.

Signed and Sealed this

Fourth Day of August, 1998

Attest:

BRUCE LEHMAN

Attesting Officer

Commissioner of Patents and Trademarks